United States Patent
Haisch et al.

(10) Patent No.: US 11,841,391 B1
(45) Date of Patent: Dec. 12, 2023

(54) SIGNAL GENERATOR UTILIZING A NEURAL NETWORK

(71) Applicant: Keysight Technologies, Inc., Santa Rosa, CA (US)

(72) Inventors: Hansjoerg Haisch, Altdorf (DE); Andy Doberstein, Ahrensburg (DE)

(73) Assignee: EYSIGHT TECHNOLOGIES, INC., Santa Rosa, CA (US)

( * ) Notice: Subject to any disclaimer, the term of this patent is extended or adjusted under 35 U.S.C. 154(b) by 1734 days.

(21) Appl. No.: 15/705,724

(22) Filed: Sep. 15, 2017

(51) Int. Cl.
| | |
|---|---|
| G06N 3/08 | (2023.01) |
| G01R 31/28 | (2006.01) |
| H01S 5/12 | (2021.01) |
| H01S 5/0625 | (2006.01) |
| H01S 5/0687 | (2006.01) |
| G02F 1/035 | (2006.01) |

(52) U.S. Cl.
CPC ....... *G01R 31/2841* (2013.01); *G02F 1/0353* (2013.01); *G06N 3/08* (2013.01); *H01S 5/0687* (2013.01); *H01S 5/06256* (2013.01); *H01S 5/1209* (2013.01)

(58) Field of Classification Search
CPC .................................. G02B 5/32; G06N 3/049
See application file for complete search history.

(56) References Cited

U.S. PATENT DOCUMENTS

| | | | |
|---|---|---|---|
| 4,691,984 A | | 9/1987 | Thaniyavarn |
| 5,790,757 A | * | 8/1998 | Meijer .................... G06F 17/13 706/45 |
| 5,943,661 A | * | 8/1999 | Katz ...................... G06N 3/105 706/16 |
| 8,533,136 B1 | * | 9/2013 | Xu ......................... G06F 30/367 706/45 |
| 2006/0153253 A1 | | 7/2006 | Diffily |
| 2009/0077543 A1 | * | 3/2009 | Siskind ................... G06F 8/447 717/136 |
| 2017/0091615 A1 | * | 3/2017 | Liu ....................... G06N 3/0445 |
| 2017/0244486 A1 | * | 8/2017 | Han ................. H04B 10/25753 |
| 2017/0363950 A1 | * | 12/2017 | Sriraman .................. G03F 1/36 |

FOREIGN PATENT DOCUMENTS

DE      102005050577 A1 * 5/2007 ............... G06N 3/02

* cited by examiner

*Primary Examiner* — Luis A Sitiriche

(57) ABSTRACT

A test apparatus and a method for operating a data processing system to generate a test signal for testing a DUT are disclosed. The apparatus includes a signal generator, artificial neural network, and controller. The signal generator generates a test signal determined by a plurality of signal generator input parameters, X, that are coupled thereto. The test signal is characterized by a plurality of calculated parameters, Y. The artificial neural network has the calculated parameters as inputs and a plurality of outputs connected to the plurality of signal generator inputs. The controller receives desired values for the calculated parameters and couples those desired values to the neural network inputs, thereby causing the test signal generator to generate a test signal having the desired values for the calculated parameters.

15 Claims, 6 Drawing Sheets

SIGNAL GENERATOR UTILIZING A NEURAL NETWORK

BACKGROUND

Signals for testing of various electrical and optical devices (DUTs) are often generated by combining a number of component signal generators to generate the actual test signal that is input to the DUT. For many tests, the signal must have characteristics that are not easily related to the inputs to the various component signal generators. In some cases, the characteristics of the test signals are set by regulatory bodies. The relationship between the inputs to the components of the test signal generator and the desired characteristics are often complex, non-linear, and non-analytic. In practice, providing a signal that meets the regulatory requirements requires an iterative process. At each iteration, the testing system inputs are adjusted, and the characteristics of the resulting output signal are measured by an appropriate signal analyzer to determine the characteristics of the test signal generated by those inputs. The inputs are then adjusted and the procedure repeated until a satisfactory signal is obtained. The process can be time consuming and presents challenges when a large number of different test signals are required to adequately characterize the DUT.

SUMMARY

The present invention includes a test apparatus and a method for operating a data processing system to generate a test signal for testing a DUT. The apparatus includes a signal generator, artificial neural network (ANN), and controller. The signal generator generates a test signal determined by a plurality of signal generator input parameters, X, that are coupled thereto. The test signal is characterized by a plurality of calculated parameters, Y. The ANN has the calculated parameters as inputs and a plurality of outputs connected to the plurality of signal generator inputs. The controller receives desired values for the calculated parameters and couples those desired values to the neural network inputs, thereby causing the test signal generator to generate a test signal having the desired values for the calculated parameters.

In one aspect of the invention, the apparatus also includes an analyzer that receives the test signal and calculates the calculated parameters.

In another aspect, the controller generates a training set, $\{X_i, Y_i\}$ for the ANN by generating a plurality of $X_i$ vectors and uses the analyzer to generate a corresponding plurality of $Y_i$. In one aspect, the controller generates the $X_i$ by randomly selecting values for each component of X between predetermined limits.

In one aspect of the invention, the apparatus, the ANN is characterized by a plurality of weights and biases, A, and the controller provides the weights and biases based on the training set. In one aspect, the controller calculates the weights and biases. In another aspect, the controller sends the training set over a network to a data processing system that provides the weights and biases.

In another aspect, the controller tests the weights and biases by selecting Y values that were not used to train the ANN, inputting each selected Y to the ANN, determining the calculated parameters from the generated test signal, and comparing the calculated parameters with the selected Y.

In one aspect of the invention, the apparatus, the controller generates training sets for each of a plurality of different fixed parameter vectors, F, and wherein the ANN is trained on a super training set that includes all of the training sets such that the resulting ANN predicts an X value corresponding to a Y value for each of the F values.

In one aspect of the invention, the apparatus, the signal generator includes a generator that produces a modulated signal that has been corrupted by an interference signal, the input parameters defining the characteristics of the interference signal and a modulation pattern.

In one aspect of the invention, the apparatus, the signal generator includes a sampled-grating multi-section DBR laser, the input parameters defining a power and wavelength for an output of the sampled-grating multi-section DBR laser.

In one aspect of the invention, the apparatus, the signal generator includes a light source having defined Stokes polarization parameters, the input parameters defining voltages to be applied across different sections of a waveguide in the light source.

The present invention also includes a method for operating a data processing system to calibrate a signal generator having input parameters, X, that produces a signal having calculated characteristics, Y. The method includes causing the data processing system to generate a plurality of sets of input parameters, $X_i$. For each $X_i$, measuring an output from the signal generator and calculating a corresponding set of calculated characteristics, $Y_i$; and training an ANN using the $X_i$ and $Y_i$ as a training set to produce an ANN that maps Y values to corresponding X values.

In one aspect of the invention, the method also includes testing the ANN with a different training set than that used to train the ANN to verify that the ANN maps each $Y_i$ to a corresponding $X_i$, which causes the signal generator to generate a signal having measured parameters that are within a predetermined error of the $Y_i$.

The present invention also includes a computer readable medium containing instructions that cause a computer to execute the above method when the instructions are executed in the computer.

DETAILED DESCRIPTION

Figure 1:
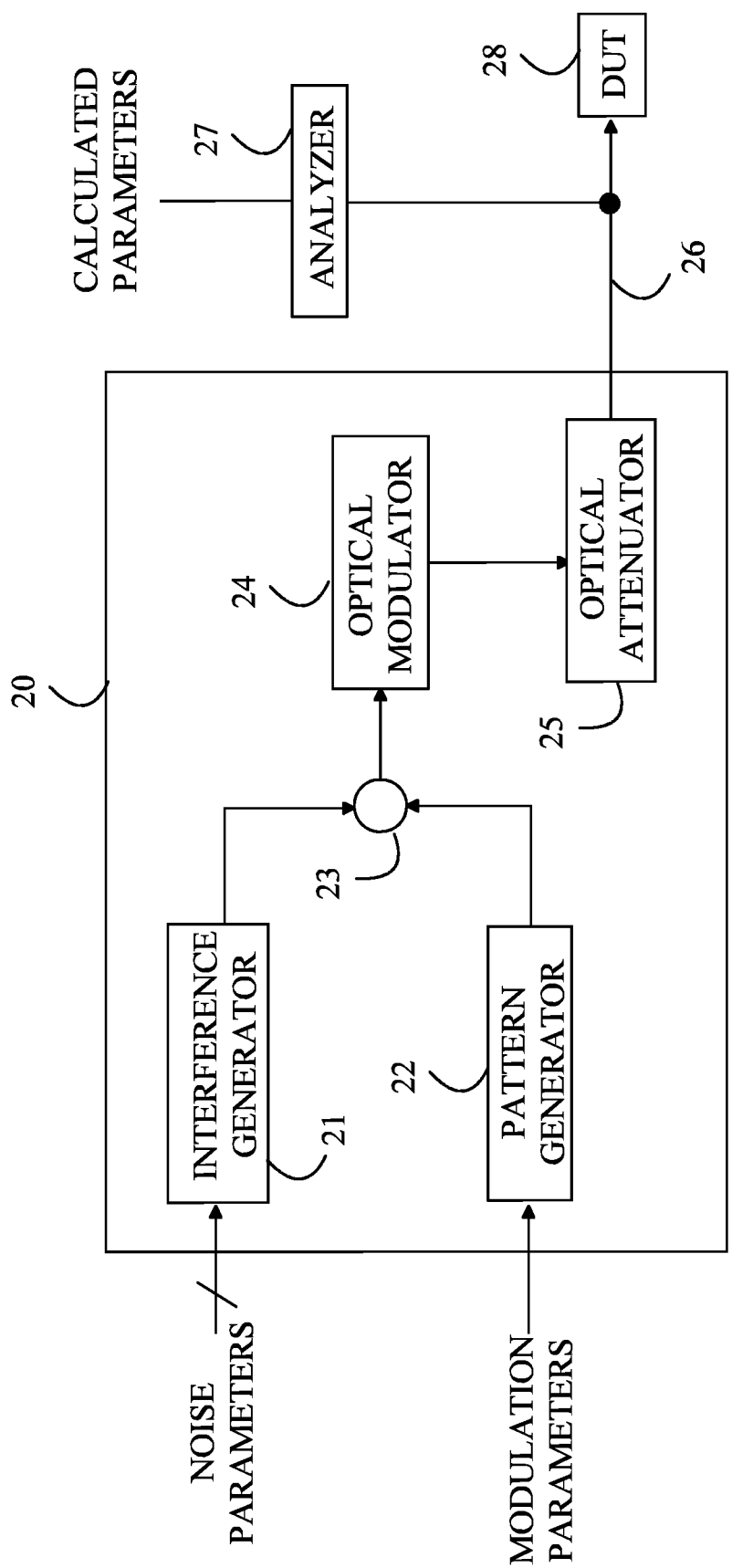
FIG. 1 illustrates a testing signal generator for generating a modulated optical test signal that is applied to a DUT such as an optical transceiver.

The manner in which the present invention provides its advantages can be more easily understood with reference to FIG. 1, which illustrates a testing signal generator for generating a modulated optical test signal that is applied to a DUT such as an optical transceiver. Test signal generator 20 generates a modulated optical signal in which the modulation pattern is corrupted by an interference signal. The interference signal is specified by a number of parameters that are input to interference generator 21, which can be a commercially available arbitrary signal generator. In the present example, the noise introduces variations in both the amplitude and timing of a modulation signal generated by pattern generator 22. The particular modulation parameter is specified by inputs to pattern generator 22. The modulation signal and interference signal are combined by combiner 23 and used to modulate an optical signal generator by optical modulator 24. The amplitude of the modulated optical signal is set by optical generator 25 before the test signal is output onto optical fiber 26.

The output optical signal is input to DUT 28 and analyzer 27. Analyzer 27 measures a set of parameters that characterize the corruption of the original modulated signal. For 4-level pulse amplitude modulation, the parameters include a transmitter and eye closure (TDECQ) and the extinction ratio or quantities calculated from these parameters.

The inputs to test signal generator 20 include the parameters that specify the interference signal and the modulation pattern. The interference signal is typically specified by an amplitude of Gaussian noise and/or sinusoidal signal to be added to the amplitude of the modulation signal and the amplitude of the timing jitter that is to be imposed on the modulation signal. The modulation pattern is specified by the sequence of values to be transmitted in a particular modulation scheme. As noted above, predicting the computed parameters from these input parameters presents significant challenges, particularly when there are multiple parameters.

In addition to these input parameters, test signal generator 20 can include other inputs that remain constant during the testing. To distinguish these parameters, the parameters that change from test to test will be referred to as the test variable parameters in the following discussion. The constant parameters will be referred to as the test constant parameters.

The present invention is based on the observation that there is a function relationship between the inputs to test signal generator 20 and computed parameters that characterize the output signal. More importantly, the inventors have observed that there is an inverse function that maps any particular set of values for the computed parameters to a unique set of input parameters that provide those values for many problems of interest and that inverse function can be well represented by an ANN.

Figure 2:
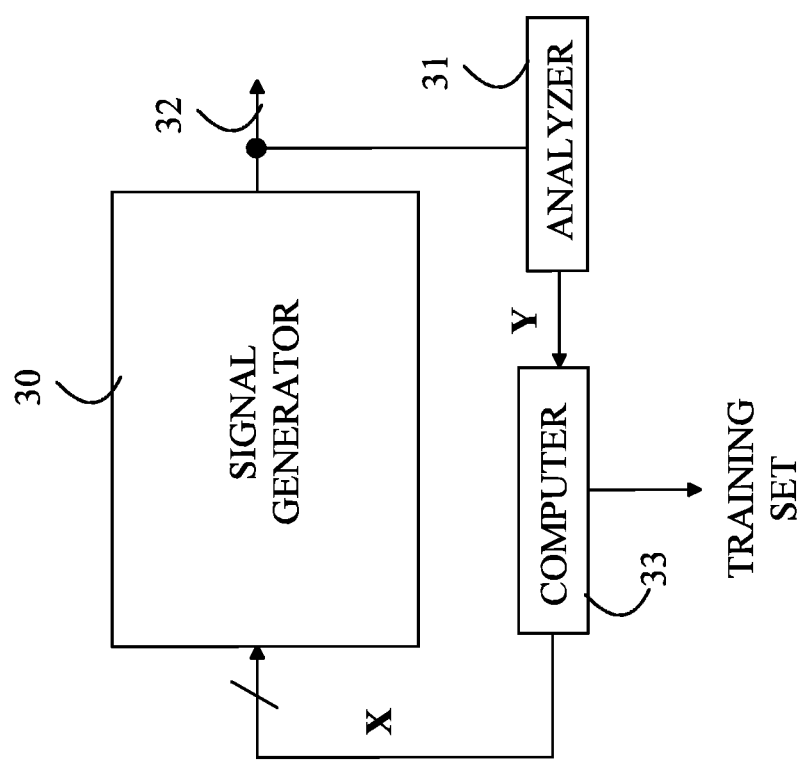
FIG. 2 illustrates one embodiment of a training setup for generating a training set for use in characterizing a signal generator.

The ANN is trained using a data set that is obtained by randomly inputting values for the various input parameters to the signal generator, analyzing the output signal generated by these inputs using the analyzer, and recording the computed parameters found by the analyzer. Refer now to FIG. 2, which illustrates one embodiment of a training setup for generating a training set for use in characterizing a signal generator 30. Signal generator 30 takes an input, a set of values, $x_1, x_2, \ldots, x_n$. To simplify the following discussion, a set of input values will be denoted by the vector X, having components $x_1, x_2, \ldots, x_n$. Signal generator 30 produces a test signal on line 32 which is input to analyzer 31 which computes the relevant computed parameters for the test signal.

For the purposes of the present discussion the output signal from the signal generator can be any signal having an amplitude, frequency, phase, or other property that varies as a function of time. The signal can be an electrical, optical, acoustical or mechanical signal. A computed parameter is defined to be any scalar parameter that describes the signal.

The computed parameters will be denoted by $y_1, y_2, \ldots, y_m$ in the following discussion. To simplify the notation, these computed parameters will be denoted by the vector, Y, in the following discussion. Computer 33 generates a set of input vectors denoted by $X_i$, for i=1 to $N_t$. Each input vector is generated by randomly choosing values of the $X_i$ between predetermined limits that represent the range of possible values for that input parameter. For each $X_i$, analyzer 31 computes a corresponding vector $Y_i$ whose components are computer parameters. This process is repeated until for each $X_i$ resulting in an $N_t$ point training data set $\{X_i, Y_i\}$.

Figure 3:
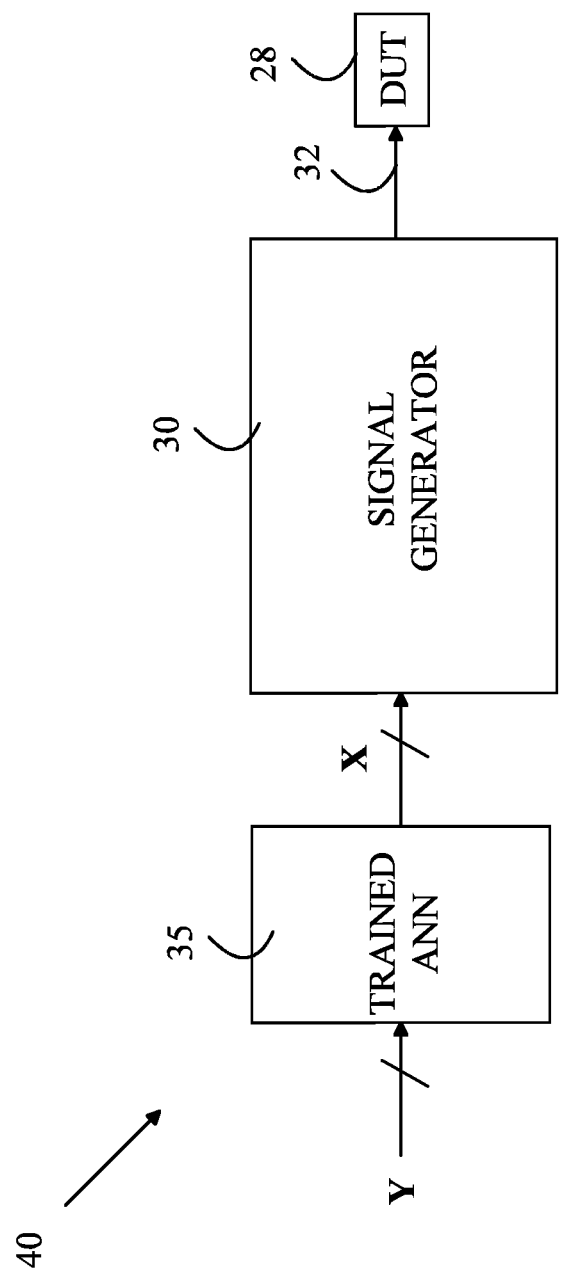
FIG. 3 illustrates a test system that utilizes an ANN to run the signal generator.

The training set is then used to train an ANN. In one exemplary embodiment, an ANN having five layers and ten hidden units with a sigmoid cost function was used to model the functional relationship between X and Y. The trained ANN is then used as an input to signal generator 30. Refer now to FIG. 3, which illustrates a test system 40 that utilizes such an ANN to run the signal generator. In test system 40, the user enters the calculated parameters Y to the trained ANN 35 whose output X is input to signal generator 30, which provides the test signal having the desired properties on line 32 to the DUT.

The data processing system that trains the ANN can be part of the test instrument or separate therefrom. The computational workload on the computational hardware during the training of the ANN is significantly greater than the computational workload in running the trained ANN. In addition, the training time can be significantly shortened by the use of special purpose hardware having a large number of computational units that run in parallel such as the graphic processing units (GPU) commonly used to provide high level video processing. However, given advances in computer technology with multiple cores and such GPUs, it is economically feasible to provide the training computer hardware as part of the test system.

Figure 4:
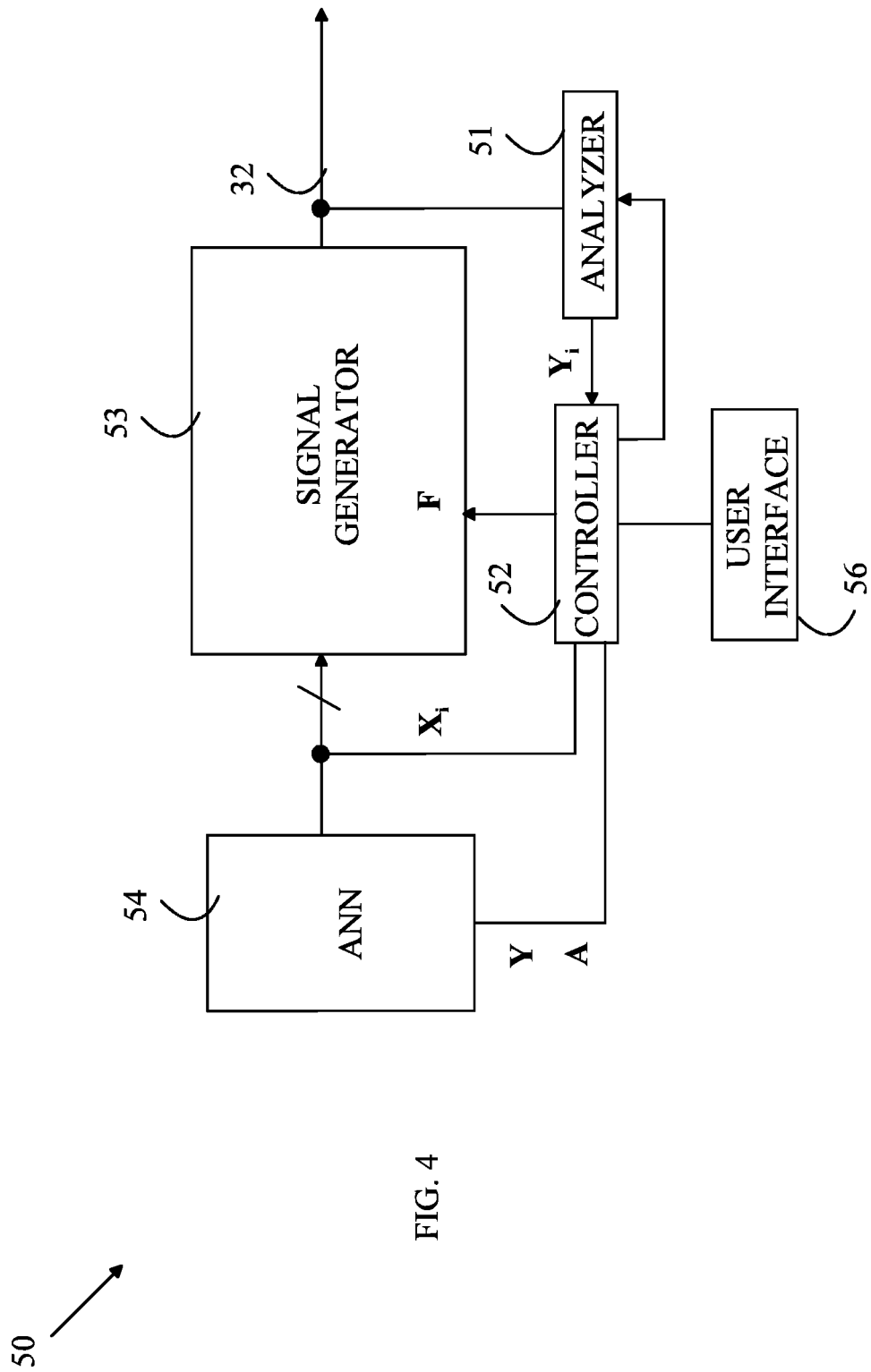
FIG. 4 illustrates a test system that includes a controller that collects the test data, trains the ANN, and then runs the test system to provide a test signal having specified output parameters.

Refer now to FIG. 4, which illustrates a test system that includes a controller that collects the test data, trains the ANN, and then runs the test system to provide a test signal having specified output parameters. Test system 50 includes a signal generator 53 that generates a test signal on line 32 in response to variable input parameters X. Signal generator 53 also accepts fixed inputs, denoted by a vector F. The fixed inputs differ from the variable inputs in that the fixed inputs remain constant for any given trained ANN.

The operation of test system 50 can be viewed as having five phases. In the first phase of operating test system 50, a user specifies the ranges of the components of X that are to be used with the trained ANN. These are also the ranges that will be used to train ANN 54. The user also specifies the signal characterization parameters that are to be computed for each output signal from signal generator 53 by analyzer 51. The values of these signal characterization parameters are the components of vector Y.

In the second phase, controller 52 generates a sequence of vectors, $X_i$, and causes signal generator 53 to generate an output signal for each $X_i$. Controller 52 then operates analyzer 51 to compute the signal characterization vector $Y_i$ corresponding to $X_i$, and stores the pair of vectors in a temporary memory associated with controller 52. Each vector, $X_i$ is generated by randomly selecting a value between the maximum and minimum values provided for each component.

In the third phase, the training parameters for ANN 54 are determined. These are the weights and biases used by ANN 54 to compute an X value corresponding to a given Y value. These weights and biases will be denoted by the vector A, whose components are the weights and biases in question. The computation of A can be performed directly on controller 52 from the training set if controller 52 has sufficient computational hardware. Alternatively, controller 52 could transmit the training set to a more computationally robust data processing system over a network connection that can include a link to the Internet. At the end of the third phase, the weights and biases are transferred to ANN 54.

In the fourth phase, controller 52 tests ANN 54 to verify that the trained ANN actually operates as desired. In one aspect of the invention, controller 52 generates random sets of desired signal properties within the ranges permitted for the signal properties and inputs the corresponding vector Y to ANN, which translates that vector to a corresponding control vector X. Signal generator 53 then generates a signal on line 32 which is analyzed by analyzer 51 to extract the actual signal properties. These observed properties are then compared with the Y value given to ANN 54. If the two vectors match to within some predetermined error limit, the test is defined to have passed. The process is repeated for a number of different randomly selected Y values. If the test fails for some subset of the allowable Y values, the user has the option to increase the training set by selecting additional training vectors and repeating the third phase with the larger training set.

In another aspect of the invention, the test set used to train ANN 54 is divided into two parts. The second part typically consists of a small test set having 10 percent of the test vectors. The larger part is used to train ANN 54 as discussed above. The smaller part is then used to test ANN 54 to verify that ANN 54 generates the X vectors in the small part when the corresponding Y vectors are presented as input.

In the fifth phase, the test system enters the production mode in which the user specifies a desired set of signal parameters to controller 52 over user interface 56. Controller 52 sends target Y value to the ANN 54 which predicts the control X vector and signal generator 53 generates the desired signal. Controller 52 can verify that the output signal has the desired properties by instructing analyzer 51 to compute the actual properties of the output signal and compare those to the Y value sent to ANN 54.

In the above-described embodiments, a training set is generated for a particular value of F. In one aspect of the invention, separate training sets are done for each of a plurality of F values. These training sets are then combined into a super training set with all of the F vectors, and the training repeated with this super training set. The resulting ANN predicts X values for both Y and the specific F values.

In the above-described embodiments, the ANN is shown as separate from controller 52; however, embodiments in which the ANN is implemented on the controller can also be constructed. While the training of the ANN can be computationally taxing for the computers of many instruments, the computations inherent in the translation of the ANN inputs to its outputs are well within the computational capability of the computer hardware in many instrument systems.

In the above-described embodiments, the training weights and biases and generation of the training set are performed on the test system, embodiments in which the manufacturer of the signal generator, or the components within the signal generator, provides the weights and biases for the ANN can also be constructed. The ANN weights and biases can be part of a package that is sold separately to buyers of the signal generator components. In this case, complex measurement protocols can be simplified by providing the weights for implementing specific ANNs.

The above-described embodiments depend on the user's choice of a calculated parameter. The only limitation for such calculated parameters is the ability of the analyzer to determine the parameter from direct observation of the signal generated by the testing system. The present invention assumes that there is a single valued inverse mapping between the input parameters to the signal generator and a particular set of calculated parameters for the signals generated by those input parameters. If no such mapping exists, the training set will be void, as no signal will have the calculated parameters.

In some cases this assumption will not be true as there may be multiple sets of input parameters that generate a particular set of calculated parameters. If there are multiple sets, the present invention may pick one of those sets in the ANN training, and hence, the present invention will work as described. However, in such a case, there may be other sets of input parameters, which will produce signals with the desired calculated parameters. Retraining the ANN with a training set that utilizes different fixed parameters for the signal generator may find one or more of the other sets of input parameters.

Figure 5:
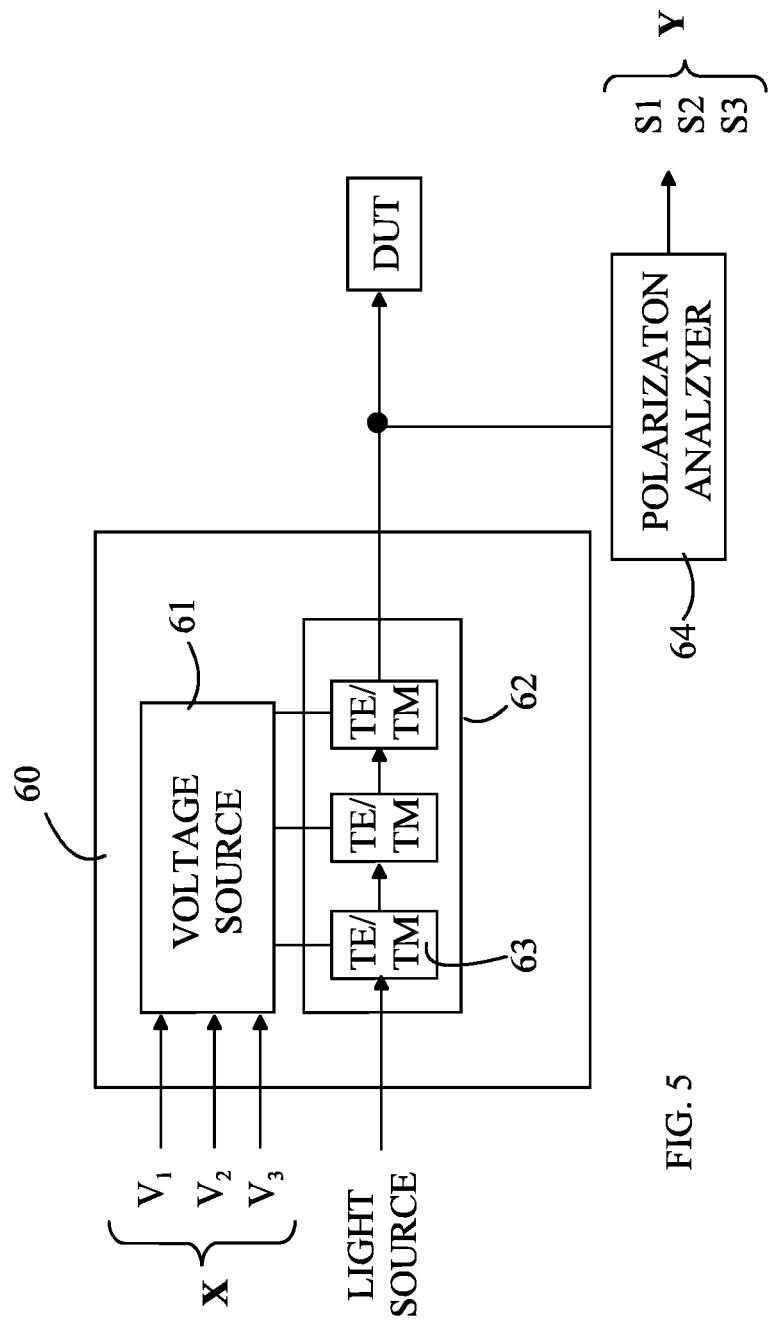
FIG. 5 illustrates a signal generator that generates an optical signal with a specified Stokes polarization.

In the above-described embodiments, the signal generator generated a modulated optical signal that was "stressed" by the addition of noise or some other signal. However, the present invention can be practiced with other forms of signal generators. Refer now to FIG. 5, which illustrates a signal generator that generates an optical signal with a specified Stokes polarization. Signal generator 60 includes a waveguide 62 having a number of electrode pairs 63 spaced along the waveguide. The voltages applied across the waveguide by these electrodes are determined by external inputs, $V_1$, $V_2$, and $V_3$, to voltage source 61, and alter the transverse-electric (TE) and transverse magnetic (TM) modes of the same material index. The resulting device is immune from many problems affecting other designs. Details of the operation of such a optical signal generator can be found in U.S. Pat. No. 4,691,984. However, the relationship between the applied voltages and the Stokes polarization is non-linear and difficult to predict. The present invention provides a method for calibrating the voltages needed to provide the desired Stokes polarization. In this case, the analyzer is a polarization analyzer 64.

Figure 6:
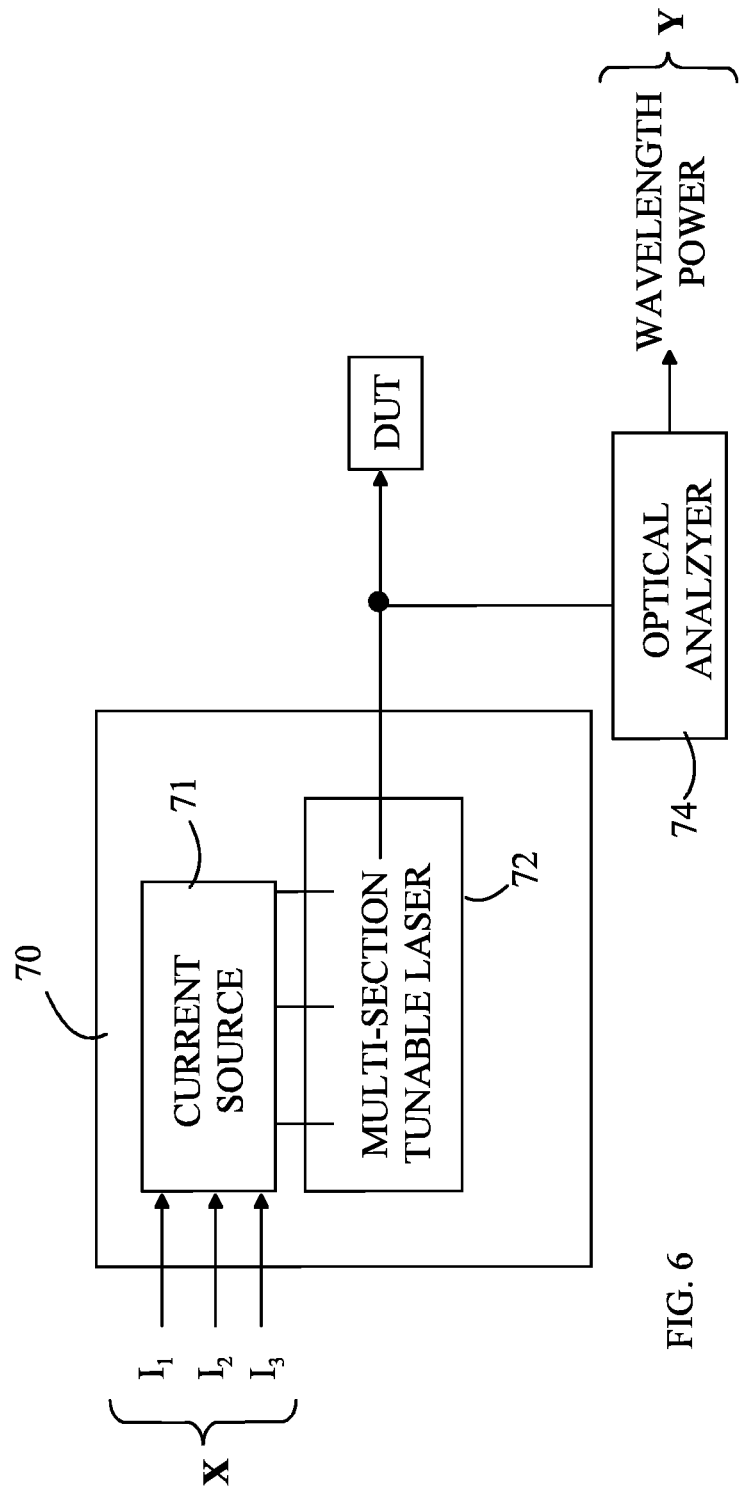
FIG. 6 illustrates one embodiment of a laser that can be used with the present invention.

Another example of a signal generator that can be utilized with the present invention is a sampled-grating multi-section DBR laser. Such a laser is constructed from a monolithic integrated laser in which the power and operating wavelength are determined by currents applied to several of the sections of the laser. Refer now to FIG. 6, which illustrates one embodiment of such a laser that can be used with the present invention. Laser 70 is controlled by three currents that are generated by current source 71 and applied to different sections of laser 72. The magnitude of each of these currents is determined by a corresponding input, $I_1$, $I_2$, and $I_3$ to current source 71. The output of laser 72 is measured by optical analyzer 74, which determines the wavelength and power of the output light signal.

The present invention also includes a computer readable media that causes a computer to execute the method of the present invention. For the purposes of the present discussion, a computer readable medium is defined to be any medium that constitutes patentable subject matter under 35 U.S.C. 101 and excludes any media that is not patentable subject matter under 35 U.S.C. 101. Examples of such media are non-transitory media such as computer disks and non-volatile memories.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An apparatus comprising:
a signal generator configured to receive a plurality of signal generator input parameters, X, and to generate a test signal determined by a plurality of signal generator input parameters, X;
an analyzer configured to receive said test signal and to calculate a plurality of calculated parameters, Y, characterizing said test signal;
a controller configured to receive said plurality of calculated parameters from the analyzer and desired values for said plurality of calculated parameters from a user interface; and
an artificial neural network trained to provide an inverse function that maps values of previous sets of calculated parameters of test signals output by the signal generator to corresponding values of previous sets of signal generator input parameters of the signal generator having values between predetermined limits that represent a range of possible values for the signal generator input parameters, respectively, wherein the artificial neural network is configured to input said plurality of calculated parameters and said desired values from the controller and to calculate revised values for another plurality of signal generator input parameters using the inverse function, thereby causing said signal generator to generate another test signal determined by the plurality of signal generator input parameters having the revised values such that the another test signal has said desired values for said plurality of calculated parameters.

2. The apparatus of claim 1 wherein said controller is further configured to generate a training set, $\{X_i, Y_i\}$ for said artificial neural network by generating a plurality of $X_i$ vectors and to use said plurality of calculated parameters from said analyzer to generate a corresponding plurality of $Y_i$ vectors.

3. The apparatus of claim 2 wherein said controller generates said $X_i$ by randomly selecting values for each component of X between predetermined limits that represent a range of possible values for the signal generator input parameters.

4. The apparatus of claim 2 wherein said artificial neural network further inputs a plurality of weights and biases, A, provided by said controller based on said training set.

5. The apparatus of claim 4 wherein said controller calculates said weights and biases.

6. The apparatus of claim 4 wherein said controller sends said training set over a network to a data processing system that calculates said weights and biases.

7. The apparatus of claim 4 wherein said controller tests said weights and biases by selecting Y values that were not used to train said artificial neural network, inputting each selected Y value to said artificial neural network, determining said calculated parameters from said generated test signal, and comparing said calculated parameters with said selected value Y.

8. The apparatus of claim 2 wherein said controller generates training sets for each value of a plurality of different fixed parameter vectors, F, and wherein said artificial neural network is trained on a super training set comprising all of said training sets such that said artificial neural network predicts an X value corresponding to a Y value for each of said F values.

9. The apparatus of claim 1 wherein said signal generator is configured to produce a modulated signal that has been corrupted by an interference signal, wherein said plurality of signal generator input parameters define a characteristic of said interference signal and a characteristic of a modulation pattern of said modulated signal.

10. The apparatus of claim 1 wherein said signal generator comprises a sampled-grating multi-section DBR laser, wherein said plurality of signal generator input parameters define a power and wavelength for an output of said sampled-grating multi-section DBR laser.

11. The apparatus of claim 1 wherein said signal generator comprises a light source having defined Stokes polarization parameters, wherein said plurality of signal generator input parameters define voltages to be applied across different sections of a waveguide in said light source.

12. A method for operating a data processing system to calibrate a signal generator having a plurality of signal generator input parameters, X, that produces a signal having calculated characteristics, Y, said method comprising:
causing said data processing system to generate a plurality of sets of said plurality of signal generator input parameters, $X_i$;
for each set of said plurality of signal generator input parameters, $X_i$, generating signals output from said signal generator in response to the set of said plurality of signal generator input parameters, $X_i$, and calculating a corresponding set of calculated parameters, $Y_i$;
training an artificial neural network using said sets of said plurality of signal generator input parameters, $X_i$, and said sets of calculated parameters, $Y_i$, as a training set to train an artificial neural network to produce an inverse function that maps Y values of the sets of calculated parameters, $Y_i$, to corresponding X values of said sets of said plurality of signal generator input parameters, $X_i$, wherein the X values are between predetermined limits that represent a range of possible X values for the signal generator input parameters, respectively;
applying the trained artificial neural network to input a plurality of calculated parameters from a test signal corresponding to a plurality of signal generator input parameters and to output values for a plurality of revised signal generator input parameters by mapping the plurality of calculated parameters to the revised signal generator input parameters using the inverse function; and
controlling the signal generator to generate another test signal using the revised signal generator input parameters provided by the trained artificial neural network.

13. The method of claim 12 further comprising:
testing said artificial neural network with another training set different from the training set used to train said artificial neural network to verify that the inverse function of said artificial neural network maps each set of the sets of calculated parameters, $Y_i$, to a corresponding set of said plurality of signal generator input parameters, $X_i$, and the set of said plurality of signal generator input parameters, $X_i$, causes said signal generator to generate a signal having measured parameters that are within a predetermined error of said set of calculated parameters, $Y_i$.

14. A non-transitory computer readable medium containing instructions that, when executed by a computer, cause the computer to:

generate a plurality of sets of signal generator input parameters, $X_i$;

for each set of signal generator input parameters, $X_i$, controlling a signal generator to generate signals in response to the set of signal generator input parameters, $X_i$;

calculate a plurality of sets of calculated characteristics, $Y_i$, corresponding to the plurality of sets input parameters, $X_i$ respectively, wherein the plurality of sets of calculated characteristics, $Y_i$, characterize the signals;

train an artificial neural network using said sets of signal generator input parameters, $X_i$, and said plurality of sets of calculated parameters, $Y_i$, as a training set to an artificial neural network to produce an inverse function that maps Y values of the sets of calculated parameters, $Y_i$, to corresponding X values of said sets of signal generator input parameters, $X_i$, wherein the X values are between predetermined limits that represent a range of possible X values for the signal generator input parameters respectively;

apply the trained artificial neural network to input a plurality of calculated parameters from a test signal corresponding to a plurality of signal generator input parameters and to output values for a plurality of revised signal generator input parameters by mapping the plurality of calculated parameters to the revised signal generator input parameters using the inverse function; and control the signal generator to generate another test signal using the revised signal generator input parameters provided by the trained artificial neural network.

15. The computer readable medium of claim 14 wherein the instructions further cause the computer to:

test said artificial neural network with another training set different from the training set used to train said artificial neural network to verify that the inverse function of said artificial neural network maps each set of the sets of calculated parameters, $Y_i$, to a corresponding set of signal generator input parameters, $X_i$, and the set of signal generator input parameters, $X_i$, causes said signal generator to generate a signal having measured parameters that are within a predetermined error of said set of calculated parameters, $Y_i$.

* * * * *